United States Patent [19]

Murrmann

[11] 3,754,321

[45] Aug. 28, 1973

[54] METHOD OF PRODUCING A SILICON TRANSISTOR DEVICE

[75] Inventor: Helmuth Murrmann, Munich, Germany

[73] Assignee: Siemens Aktiengesellschaft, Munich, Erlangen, Berlin, Germany

[22] Filed: Mar. 18, 1971

[21] Appl. No.: 125,701

[30] Foreign Application Priority Data

Mar. 19, 1970 Germany................... P 20 13 220.1

[52] U.S. Cl...................................... 29/578, 29/589
[51] Int. Cl.............................................. B01j 17/00
[58] Field of Search............................... 29/578, 589

[56] References Cited

UNITED STATES PATENTS 3,523,038 8/1970 Sanders................................. 29/589
3,634,931 1/1972 Kano.................................... 29/589

*Primary Examiner*—Charles W. Lanham
*Assistant Examiner*—W. Tupman
*Attorney*—Curt M. Avery, Arthur E. Wilfond, Herbert L. Lerner and Daniel J. Tick

[57] ABSTRACT

To contact a silicon transistor produced according to the method of planar technique, the electrode which contacts the base zone is first mounted and fastened by a metallurgical process upon the silicon of the base zone. Then, the emitter electrode is mounted upon the emitter zone and so connected with the same that the metal of the emitter electrode cannot short circuit or otherwise impair the p-n junction of the emitter zone (entire emitter).

7 Claims, 2 Drawing Figures

METHOD OF PRODUCING A SILICON TRANSISTOR DEVICE

The invention relates to a method of producing a transistor device, more particularly of silicon, comprising an emitter zone produced through a masked diffusion of activator atoms, into the semiconductor. In this transistor arrangement, at least the emitter-base-pn-junction is covered by the remnants of the insulating layer which was used as a diffusion mask during the production of the emitter zone. The part of the semiconductor surface, coated by the emitter electrode and bordered by the insulating layer, is identical with the part of the semiconductor surface which was not covered by the diffusion mask during the production of the emitter zone. This may relate to a single transistor or to a transistor combined with other elements within a single semiconductor body, particularly in an integrated circuit.

The production of planar transistors (described, e.g., in POST OFFICE OF ELECTRICAL ENG. Vol. 56 (Jan. 1964) No. 4, pages 239–243) is known to result in a transistor with a tub-shaped emitter zone produced by diffusion and embedded into a planar portion of a monocrystalline silicon body, the emitter zone being enclosed by a similarly constructed base zone. The p-n junctions are covered by the remnants of the diffusion mask. Since, as a rule the mask is made of insulating material, preferably $SiO_2$, these remnants remain on the semiconductor surface and function as a protective layer for the finished element.

Figure 1:
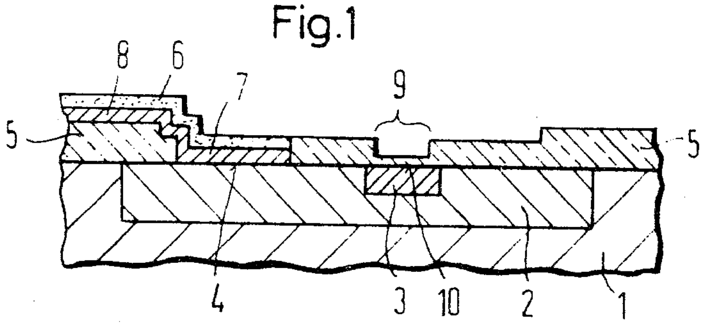
Figure 2:
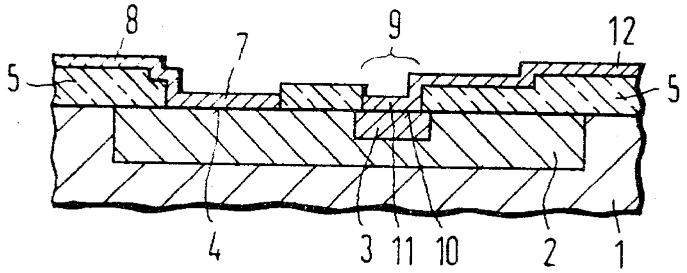

FIG. 1 illustrates the conditions attained immediately following the alloying-in of the base zone, while FIG. 2 shows the condition following the application and the structure etching of the emitter electrode and the conductor path which contacts it.

The production of such a planar transistor brings it about that the gross concentration of activators is greatest in the emitter zone and least in the collector zone which is formed by the original material of the original crystal. On the other hand, the net concentration of dopants is the smallest in the base zone and the greatest in the emitter. For many reasons aluminum is preferred as the contacting material for the emitter and the base. When an n-conductive zone is contacted, care must be taken that the concentration donor remains greater in the silicon region immediately adjacent to the aluminum; that the concentration of aluminum atoms which dissolve in the silicon during the fastening of the aluminum electrode and which electrically act as acceptors.

Of the actual contacting, the surface portions of the emitter zone and of the base zone which are intended for contacting, are first freed in a defined manner, from the $SiO_2$—contaning layer which usually covers the surface portions. To this end, a photoresist is employed whereby that surface portion selected for contacting is left free. Thereafter, these surface portions are freed from the adhering oxide layer with dilute hydrofluoric acid. The thus exposed silicon surface is now provided with a metallization, particularly of aluminum, which is preferably vapor-deposited on. The metallization may also be applied in another manner particularly by cathode sputtering or by galvanic means.

This metallization may be limited, from the onset, to the contact points of the emitter and base zone. This requires an appropriate mask which preferably also consists of photoresist. (If necessary, the etching mask which was first used to remove the oxide from the contact points may be employed for this purpose; it is obvious that the processing temperature must then be so low that the photoresist mask will not be damated.)

On the other hand, after the contact places are exposed, the entire surface of the device may be provided with a metal coating which is etched away again using a photoresist mask from these places where the metal coating is not needed. Next to the contact places, such places may also be found at the $SiO_2$ layer covering the remaining device or at another insulating layer and when the device is completed, they will serve as a protective shield, a stabilizing electrode or a conductor path which contacts the actual electrodes and provides further contacting.

In transistors which are intended for use at very high frequencies, the area of the emitter-base-pn- junction is made as small as possible, so as to obtain a very low capacity for this junction. This means a narrow emitter diffusion window in the masking $SiO_2$ layer with a width or diameter of less than 4 $\mu$m and an emitter depth of penetration in the order of magnitude of $10^{-7}$m. With such dimensions, one is forced to fully reopen the diffusion window in the masking oxide layer, which had been used in the production of the emitter in order to provide an adequate contacting possibility for the emitter zone. For this reason, the silicon surface covered by the emitter electrode is identical in such transistors, with the surface wherein the activator that doped the emitter had previously been diffused into the emitter region.

When a transistor with such an emitter is contacted, the usually simultaneous contacting of the base and emitter zone is not recommended as was recognized by the present invention. The depth of penetration of the base electrode required for producing a barrier-free base contact leads, in the otherwise favorable simultaneous production of the emitter and base electrode, to an equivalent penetration depth of the emitter electrode which easily results in an impairment of the emitter-base p-n junction and is the cause of notable losses during the completion process. It is, therefore, preferable to mount the emitter contact only after the base electrode has been produced.

According to the present invention the base electrode is first mounted with the base zone in a metallurgical process and that only then the metal of the emitter electrode be applied upon the emitter zone. This results in a considerable reduction of the rejects and affords a notable improvement of the electrical characteristics of the produced semiconductor devices since the heating processes necessary for producing the base electrode, have no affect upon the emitter contacting in any case.

During the mounting and metallurgical processes required for obtaining the barrier-free base contact (alloying-in or sintering-in), it is recommended that the emitter region be covered completely. Therefore, in the method of the present invention, only the contact location of the base electrode is first freed of the adhering oxidizing layer, thereafter the metal of the base electrode and the possibly provided conductor paths, shieldings, etc., are applied over the total area and finally the geometrical form of these contacts, conductor paths, etc., is worked out with the aid of a photoresist etching technique, by using an etchant which will not attack the silicon surface and the $SiO_2$, coating the former.

Only then the oxide from the emitter window, which still stems from the emitter diffusion, is completely removed and finally, the emitter contact is mounted.

It should be noted that in most cases the diffusion which is usual in the planar technique, is effected from the gaseous or vaporous phase, via intermediate phases of oxides of the doping elements.

Therefore, an oxidation also takes place at the portion of the silicon surface not covered by the masking, which portion may be undercoated for the dopant, if necessary by using an oxidizing carrier gas. At any rate, at the onset of the method according to the present invention, there is usually an emitter zone whose edges are coated with a thicker masking layer and its interior with a considerably thinner oxide layer. In order to contact this emitter zone, the thinner part of the oxide layer must be etched away so that exactly that part of the silicon surface which, during the emitter production, was used as an entrance gate for the dopant into the silicon, is also available as a contacting area. To this end, the arrangement may also be treated carefully over the entire area with dilute hydrofluoric acid, for such time until the thinner oxide has uniformly vanished in the inner part of the surface of the emitter zone, while the parts which were covered during the emitter diffusion are still coated. Then, the emitter-base-pn junction will, in any case, be covered by the edge of the old masking even though barely. The invented method considers this fact by providing that each deep penetration of the emitter electrode into the emitter zone is prevented.

As metal for producing the base electrode, the usual materials may be used, particularly aluminum and platinum. As metal for emitter electrodes in the sense of the invention, titanium chromium, zirconium and molybdenum, for example, may be used. For the base electrode, these materials insure an impeccable, barrier-free contact with the base zone. For the emitter electrode, the danger of a deep penetration of the emitter contact into the emitter zone is strongly counteracted. Some of these metals, such as Al, Cr, Mo also adhere to an $SiO_2$ or $Si_3N_4$ layer which coats the silicon surface so that they are suitable as materials for conductor paths, shields, etc. Au or Ag may also be suitable for such metallizations.

The invention will be described in greater detail in FIGS. 1 and 2 with reference to an embodiment example.

After the production of the emitter zone 3 and the base zone 2, on the flat side of a wafer-shaped silicon monocrystal 1 having the conductance type of the emitter zone, carried out in accordance with the planar technique, the contact area 4 of the base zone 2 is exposed by a locally removing the $SiO_2$ layer 5, which covers the device. The respective surface is then coated with a layer of the metal provided for the base electrode. This layer is coated with a photoresist mask 6 which is to be removed during the subsequent etching process. To this end, an etchant is used which neither attacks the material of the protective layer 5 nor Si nor the photoresist mask 6. Following this etching process, of the originally total area coating metal layer, only the base electrode 7 remains at the contact area 4, as well as a conductive path 8, which contacts the base electrode. These comprise, preferably Al and/or Pt. The device is then tempered, preferably after removal of the photoresist mask 6 in order to alloy the base electrode into the base zone.

To produce the emitter electrode, the window 9 which was used during the diffusion of the activator, which formed the emitter 3 into the $SiO_2$ layer 5, is reopened, thereby exposing the contact area 10 for the emitter. Now a layer is applied in a total area for the formation of the emitter electrode 11 and, possibly, a conductor path 12 which contacts said electrode, both consisting, for example, of titanium or a mixture of Ti and Al or a double layer of Ti and Al or one of Ti and Au or Ti and Ag. The conditions for the application and for further work processes are so selected that a notable penetration of the emitter electrode into the emitter zone will not occur.

With the aid of a photoresist mask the base and the emitter contact areas including the contact providing conductor paths, are now coated and the regions of layers 11 and 12 which are not coated by the resist, are removed, whereby the etchant which is used for removing the excessive metal of layers 11 and 12 is so selected that the layer 8 coated by the excess metal is not attacked or only insignificantly so. (The etching process should be stopped exactly at that moment when the metals 11 and 12 are removed at the undersired places).

The method is more complicated if the metal of the emitter electrode is harder to dissolve in the available etchant than the metal of the base electrode. Nothing else remains to be done here but to coat the metallizing portions 7 and 8 consisting of the metal of the base electrode during the vapor deposition of the metal for the emitter electrode. If the resulting metallization is not limited from the start to portions 11 and 12 thus requiring an etching process for removing the emitter electrode 11 and the conductor path 12 from an extensive metallization, then the parts consisting of the metal of the base electrode must also be coated during this etching process, for example, with photoresist or with wax.

A coating of the previously applied metal parts during the production of the emitter electrode is not required, on the other hand provided the etchant used for etching the structure of the emitter electrode 11 or of the conductor path 12, will attack the metal of the base electrode more slowly than that of the emitter electrode. It then becomes necessary just as in the aforedescribed case, to coat the emitter electrode 11 or the conductor path 12, with an etching mask. However, no coating of the base electrode 7 or of the conductor path 8, which covers the same, is necessary. If the etching process is stopped when the excess metal of the emitter electrode is just removed from the $SiO_2$ layer 5, the electrodes 7 or the conductor path 8 will still be attacked only slightly.

It is clear that the etchant used for the preparation of the base and emitter electrode must not attack the Si nor the $SiO_2$ of the layer 5.

I claim:

1. The method of producing a planar silicon transistor, which comprises; after completion of the diffusion processes which generate the base zone and generate the emitter zone, by use of a diffusion mask comprising an $SiO_2$ layer produced through oxidation of the silicon surface remaining as a protective layer in the completed transistor; opening a contact window to the silicon surface, only at the point intended for the base electrode, in the $SiO_2$ layer covering the silicon surface at the base zone and the emitter zone; applying a metal barrier free contact with the base zone of the silicon surface thus exposed; alloying the contact metal to the silicon surface by a temperature treatment to form an ohmic contact with the base zone; removing the $SiO_2$ layer from the surface of the emitter zone so that only that part of the silicon surface is exposed which was presented to the doping material forming the emitter zone during the emitter diffusion; applying, to the now exposed part of the silicon surface, a metal capable of forming a barrier free contact with the emitter zone in such a manner that the silicon surface exposed at this point is completely covered with the metal; and, finally, choosing the metal of the emitter electrode so that this electrode practically cannot penetrate into the emitter zone even if subsequent temperature processes are applied.

2. The process of claim 1, wherein during the formation of the base contacts, the emitter region cannot react with the base electrode and possible conductor paths on the insulating diffusion masking which covers the semiconductor surface.

3. The process of claim 2, wherein the base electrode and emitter electrode in form of enlarged regions are placed upon the semiconductor surface or the insulating masking, covering the same, this metallization is then reduced through photoetching technique to the regions provided for the electrodes conductor paths and shieldings.

4. The process of claim 3, wherein different metals are used for the base electrode and for the emitter electrode.

5. The process of claim 4, wherein the emitter electrode is neither sintered in nor alloyed in.

6. The process of claim 5, wherein simultaneously with the base electrode or with the emitter electrode, at least one conductor path which covers the masking insulating layer on the semiconductor surface, is applied.

7. The process of claim 6, wherein the base electrode is of aluminum or platinum and the emitter electrode is of titanium, zirconium, nickel or molybdenum.

* * * * *